United States Patent [19]

Ohba et al.

[11] Patent Number: 5,055,870
[45] Date of Patent: Oct. 8, 1991

[54] WATERLESS PRESENSITIZED LITHOGRAPHIC PRINTING PLATE DEVELOPING APPARATUS

[75] Inventors: Hisao Ohba; Susumu Yoshida; Toru Miura, all of Shizuoka, Japan

[73] Assignee: Fuji Photo Film Co., Ltd., Kanagawa, Japan

[21] Appl. No.: 479,134

[22] Filed: Feb. 13, 1990

[30] Foreign Application Priority Data

Feb. 17, 1989 [JP] Japan .................................. 1-37971
Feb. 21, 1989 [JP] Japan .................................. 1-41160

[51] Int. Cl.⁵ ............................................. G03D 5/04
[52] U.S. Cl. ................................. 354/317; 354/324; 354/325; 15/77; 15/102
[58] Field of Search ............... 354/317, 319, 324, 325; 15/77, 100, 102; 430/302, 303, 309, 331

[56] References Cited

U.S. PATENT DOCUMENTS

| | | |
|---|---|---|
| 4,378,423 | 3/1983 | Suezawa et al. |
| 4,588,277 | 5/1986 | Buckler .............................. 354/317 |
| 4,937,169 | 6/1990 | Schlosser et al. .................... 430/162 |
| 4,963,472 | 10/1990 | Schlosser et al. .................... 430/303 |

FOREIGN PATENT DOCUMENTS

| | | |
|---|---|---|
| 44-23042 | 10/1969 | Japan . |
| 46-16044 | 4/1971 | Japan . |
| 48-94504 | 12/1973 | Japan . |
| 50-50102 | 5/1975 | Japan . |
| 54-26923 | 9/1979 | Japan . |
| 55-22781 | 6/1980 | Japan . |
| 56-23150 | 5/1981 | Japan . |
| 63-33140 | 7/1988 | Japan . |
| 1-159644 | 6/1989 | Japan . |
| 1-257847 | 10/1989 | Japan . |

Primary Examiner—A. A. Mathews
Attorney, Agent, or Firm—Sughrue, Mion, Zinn Macpeak & Seas

[57] ABSTRACT

A waterless presensitized lithographic printing plate developing apparatus for processing a waterless presensitized lithographic printing plate on which an image has been exposed includes a developing section for developing the waterless presensitized lithographic printing plate by an aqueous developing solution containing an organic solvent. Therefore, water and an aqueous solvent can be simultaneously applied onto the waterless presensitized lithographic printing plate in this developing section so that a reduced size and shortened processing time can be achieved.

19 Claims, 2 Drawing Sheets

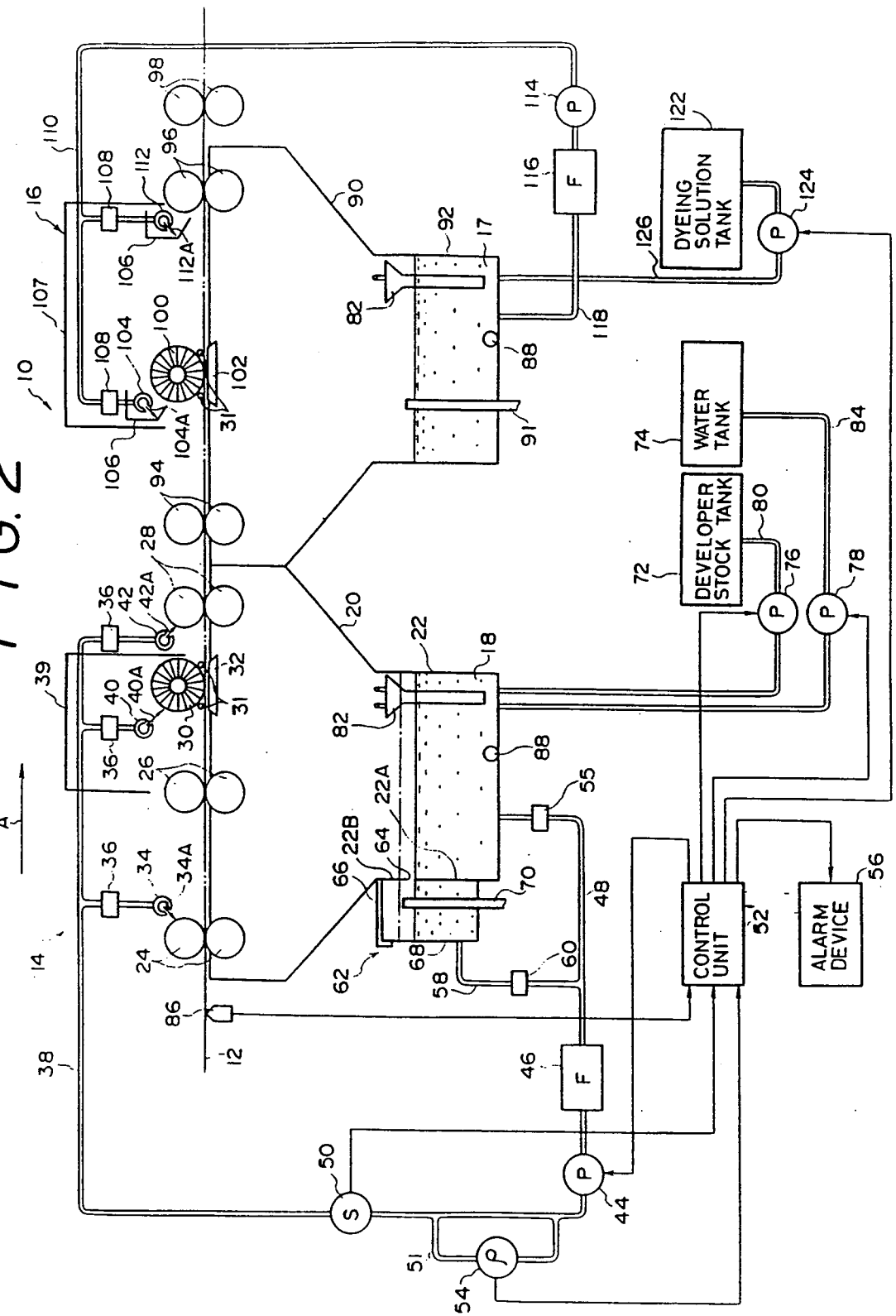

WATERLESS PRESENSITIZED LITHOGRAPHIC PRINTING PLATE DEVELOPING APPARATUS

BACKGROUND OF THE INVENTION

1. Field of the Invention

The present invention relates to a presensitized lithographic printing plate processing apparatus for processing a presensitized lithographic printing plate requiring no damping water (which will be referred to as a waterless presensitized lithographic printing plate or a waterless PS plate hereinafter) having an image exposed thereon.

2. Description of the Prior Art

Waterless PS plates with a silicone layer as an ink repellent layer which have been proposed include a first type having a photo-solubilizable or insolubilizable, photo-sensitive layer and a silicone rubber layer laminated on a substrate, (described in Japanese Patent Publication Nos. 23042/69 and 16044/71), and a second type having a photo-adherent, photo-sensitive layer and a silicone rubber layer laminated on a substrate, (described in Japanese Patent Application Laid-open Nos. 94504/73 and 50102/75). Several tens of thousands of prints can be made using these waterless PS plates without using damping water.

In the former case, the solubilization or insolubilization of the photosensitive layer by exposure provides the negative-type or positive-type printing plate. In a developing process of such a waterless PS plate, the exposed area of the photo-sensitive layer of the photo-solubilization type waterless PS plate or the unexposed area of the photo-sensitive layer of the photo-insolubilization type waterless PS plate is dissolved by water, alcohol or the like, and the silicone rubber layer in an image area is rubbed off thereby exposing the hydrophilic printing substrate to provide a negative type or positive type printing plate.

In such process, however, the silicone rubber layer is forcedly peeled off by rubbing with a brush or the like, while applying the developing solution. Hence, the silicone rubber layer which should remain as a non-image area on the surface of the PS plate may be damaged.

On the other hand, in the processing of a the second type of waterless PS plate, the silicone rubber layer in the unexposed area is selectively peeled off by use of a developing solution capable of swelling only the silicone rubber layer without substantially dissolving the photo-adherent, photo-sensitive layer, by utilizing the fact that the photo-adherent, photo-sensitive layer and the silicone rubber layer are firmly photo-adhered by exposure.

When such developing process is used, the good peeling characteristics of the silicone rubber layer provide a sharp dot edge as compared with the former example. But development requires a long time because of the relatively large interfacial adhesion force between the silicone rubber layer and the photo-adherent, photo-sensitive layer in the unexposed area. Moreover, in order to obtain a very small dot in a high-light area with a good reproducibility, it is necessary to rub the plate surface with a relatively strong rubbing force. Thus, it is difficult to completely overcome the disadvantage that even the silicone rubber layer which should remain as a non-image area on the plate surface is liable to be damaged.

A developing process has been proposed in Japanese Patent Publication No. 33140/88, which comprises eluting a portion or the whole of the photo-sensitive layer in the image area with a processing solution capable of dissolving a portion or the whole of the photo-sensitive layer in the image area, and then peeling off the silicone rubber layer in the image area by rubbing the plate surface in the presence of water of a water-based solvent incapable of swelling the silicone rubber layer.

However, this developing process is accompanied by the problem of a need for a long developing time. This is because the development comprises the two steps of eluting a portion or the whole of the photo-sensitive layer in the image area and peeling off the silicone rubber layer with water or an aqueous solvent incapable of swelling the silicone rubber layer.

Another problem is that the developing process comprises the two steps which require developing tanks for each step. Further, a dyeing tank for the dyeing process for the inspection of the plate after processing may be disposed downstream of the developing tank, resulting in a large-sized processing apparatus.

A further problem is there is the need for a feeder for supplying water or an aqueous solvent onto the plate surface in addition to the developing solution for eluting a portion or the whole of the photo-sensitive layer in the image portion, a pipe or the like between such feeder and the developing tank resulting in a complicated apparatus.

SUMMARY OF THE INVENTION

With the foregoing in view, it is an object of the present invention to provide a waterless presensitized lithographic printing-plate processing apparatus which is free from the need for a water feeder and a pipe between the feeder and a developing tank and to provide a simplified construction and reduced size of the processing apparatus, and further to provide reduced processing time.

To attain the above object, there is provided a waterless presensitized lithographic printing plate processing apparatus for processing a waterless presensitized lithographic printing plate on which an image has been exposed while being transported, comprising a developing device for developing said waterless presensitized lithographic printing plate by using an aqueous developing solution containing an organic solvent, and a developing solution recovery tank for recovering excessive aqueous developing solution.

With such construction, the waterless presensitized lithographic printing plate can be developed by the aqueous developing solution containing an organic solvent in the developing device, and the excessive developing solution can be recovered in the developing solution recovery tank.

In addition, the waterless presensitized lithographic printing plate processing apparatus further includes a dyeing device disposed downstream of the developing solution recovery tank in the direction of transportation of the printing plate for dyeing the developed waterless presensitized lithographic printing plate with an aqueous solution containing a dye.

Therefore, the waterless presensitized lithographic printing plate can be dyed by the aqueous dyeing solution after being developed by the aqueous developing solution in the developing device.

In this way, the developing process can be of a single step, which requires no pipe for supplying water or an aqueous solvent onto the plate surface. Thus, it is possible to provide a reduction in size of the processing apparatus according to the present invention. In addition, the developing period can be shortened, because the developing process comprises only one step.

Aqueous developing solutions containing an organic solvent which can be used herein includes those proposed in Japanese, Patent Application Nos. 317843/87 and 86177/88.

Waterless presensitized lithographic printing plates which can be used herein include those proposed in Japanese Patent Publication Nos. 26923/79; 22781/80 and 23150/81.

The above and other objects, features and advantages will become apparent upon reading of the following detailed description of the preferred embodiments in conjunction with the accompanying drawings.

BRIEF DESCRIPTION OF THE DRAWINGS

FIG. 2 is a schematic view of a waterless presensitized lithographic printing plate processing apparatus according to a second embodiment of the present invention.

DESCRIPTION OF THE PREFERRED EMBODIMENTS

Figure 1:
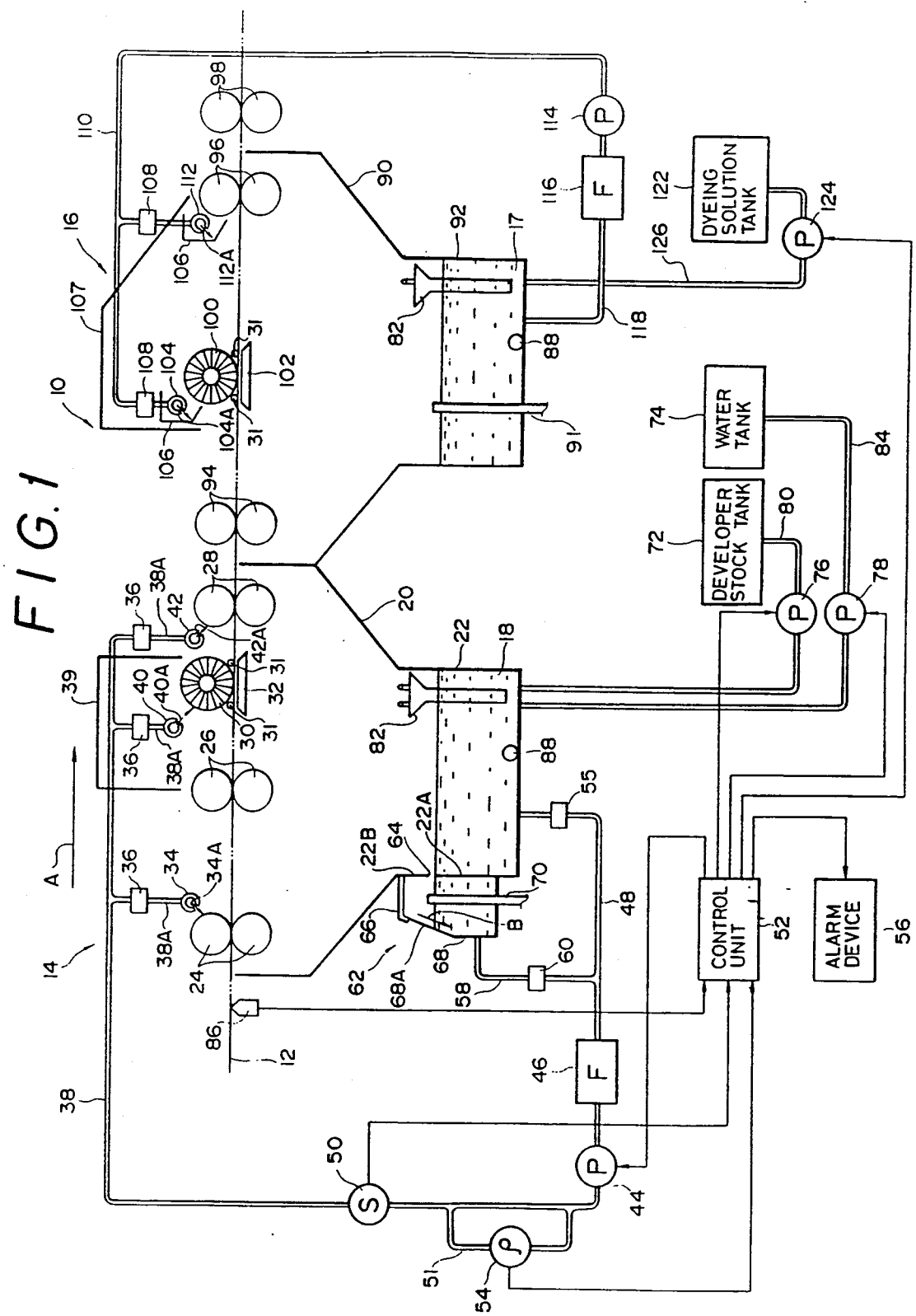
FIG. 1 is a schematic view of a waterless presensitized lithographic printing plate processing apparatus according to a first embodiment of the present invention.

Referring to FIG. 1, there is illustrated a first embodiment of a waterless presensitized lithographic printing plate processing apparatus 10 to which the present invention is applied. The waterless presensitized lithographic printing plate processing apparatus 10 comprises a developing section 14 and a dyeing section 16, in which a waterless PS plate 12 is developed and then subjected to a dyeing treatment for inspection.

The waterless PS plate 12 used herein may be that which is proposed in Japanese Patent Application No. 86177/88 and which comprises a substrate bearing a primer layer, a photo-sensitive layer, a silicone rubber layer and a protective film which are sequentially laminated thereon.

The developing solution 18 used in the developing section 14 may be an aqueous developing solution containing an organic solvent as proposed in Japanese Patent Application Nos. 317843/87 and 86177/88. Dyeing solution 17 used in the dyeing section 16 may contain Crystal Violet, Astrazone Red or the like.

A developing tank body 20 in the developing section 14 is opened upwardly and has a bottom formed into an inverted chevron shape so that a developing solution recovery tank 22 is formed at the center of the bottom. The developing solution is contained in the developing solution recovery tank 22.

Conveyor roller pairs 24, 26 and 28 are disposed at an upper portion of the developing tank body 20 in sequence from an inlet for the waterless PS plate 12. The conveyor roller pairs 24, 26 and 28 are supported on a rack sideplate (not shown) and rotate to transport the waterless PS plate 12, which is pressed between them, in the direction of arrow A in FIG. 1 upon transmission of a driving force from driving means (not shown). The conveyor roller pairs 4, 26 and 28 may be made of common rubber (such as silicone, EPT and NBR) to prevent the scratching of a surface of the waterless PS plate 12 transported in the direction of the arrow A. The pair of conveying rollers 28 is disposed at the most downstream portion of a transporting path for the waterless PS plate 12 in the developing section 14 and serve as squeezing rollers for squeezing off the developing solution from the waterless PS plate 12.

A brushing roller 30 is disposed between the conveyor roller pairs 26 and 28. The brushing roller 30 scrapes off the photo-sensitive layer and the silicone layer corresponding to an image area on a surface of the waterless PS plate being conveyed by rubbing the plate surface. The brushing roller 30 is also supported on the sideplate (not shown) in the same manner as the conveyor roller pairs 24, 26 and 28 and rotates in the same direction (i.e., in a counterclockwise direction in FIG. 1) as the direction of rotation of the conveyor roller pairs 24, 26 and 28 upon transmission of a driving force from a driving means (not shown). The brushing roller 30 is formed by embedding a brush material in a plastic or metal roll and rotates in a forward direction (a counterclockwise direction in FIG. 1) with respect to the conveying direction for the waterless PS plate 12, thereby rubbing the surface of the PS plate 12. Alternatively, the brushing roller may be rotated in a clockwise direction. The number of rotations of the brushing roller 30 may be set at 100 to 500 rpm, preferably, 200 to 400 rpm. Further, it is preferred that a bar 31 be positioned to prevent the end edge of the waterless PS plate 12 from moving up and down.

Scraping off the photo-sensitive layer and the silicone layer on the surface of the waterless PS plate 12 is further improved by the rotation and axial reciprocal movement of the brushing roller 30.

A support plate 32 made of a relatively soft material such as plastics, rubber or the like, e.g., high-density polyethylene, is disposed below the brushing roller 30. When the waterless PS plate 12 is passed through the thus-defined passageway, the surface of the PS plate 12 is rubbed by the brushing roller 30 while the PS plate 12 is being supported on the support plate 32, so that the photo-sensitive layer and the silicone layer corresponding to the image area are reliably scraped.

A spray pipe 34 is disposed above the conveyor roller pair 24. Discharge nozzle holes 34A, which face the upper roller of the pair of conveyor rollers 24, are provided in the spray pipe 34 at a suitable axial spacing. The spray pipe 34 is connected by a pipe 38 to a developing solution supplying device, which will be described hereinafter, through a valve 36. By this device, the developing solution 18 is fed into the spray pipe 34, discharged onto the upper roller of the pair of conveyor rollers 24 and thus applied onto the waterless PS plate 12.

Spray pipes 40 and 42 are also disposed between the conveyor roller pairs 26 and 28. The spray pipe 40 is disposed between the brushing roller 30 and the conveyor roller pair 26, and discharge nozzle holes 40A and 42A are placed in a spray pipes 40 and 42 in the similar manner as in the spray pipe 34. The discharge nozzle holes 40A in the spray pipe 40 face the brushing roller 30. The spray pipe 40 is also connected to the developing solution supplying device, which will be described hereinafter, by a pipe that branches from the pipe 38, in the same manner as in spray pipe 34, through a valve 36. This permits the developing solution to be fed into the spray pipe 40 and discharged and supplied to the brushing roller 30.

The spray pipe 42 has discharge nozzle holes 42A which face the upper roller of the pair of conveyor rollers 28. The spray pipe 42 is also connected to the developing solution supplying device which will be described hereinafter through the valve 36 by a pipe branched from the pipe 38. This permits the developing solution 18 to be fed into the spray pipe 42 and discharged to the upper roller of the pair of conveyor rollers 28.

A cover 39 having a substantially inverted U-shaped section covers an area from the conveyor roller pair 26 to the brushing roller 30. The cover 39 prevents the developing solution from being splashed by the brushing roller 30.

The developing solution supplying device comprises a circulation pump 44, a filter 46 and a pipe 48 which permits liquid flow between the circulation pump 44 and the developing solution recovery tank 22.

The circulation pump 44 which is a variable-flow rate pump is connected to a control unit 52, so that the flow rate discharged therefrom can be controlled. The pipe 38 is connected to an outlet of the circulation pump 44, and one end of the pipe 48 is connected to an inlet of the circulation pump 44. The other end of the pipe 48 is connected through a valve 55 to the bottom of the developing solution recovery tank 22. The operation of the circulation pump 44 causes the developing solution within the developing solution recovery tank 22 to be drawn into the circulation pump 44 through the pipe 48 and passed through the pipes 38 and 38A to the spray pipes 34, 40 and 42.

A flow rate sensor 50 is disposed in the pipe 38 and detects the flow rate of the developing solution passing through the pipe 38. The flow rate sensor 50 is connected to the control unit 52 to transfer the flow rate value detected by the sensor 50. An ordinary flowmeter can be used as the flow rate sensor, but a rotatable type is preferred in order to reduce the size of the apparatus.

A bypass pipe 51 is provided between the flow rate sensor 50 and the circulation pump 44, and an electric conductivity detector 54 is disposed in the pipe 51 and detects the electric conductivity of the developing solution passing through the pipe 38. The electric conductivity detector 54 is connected to the control unit 52 to transfer the detected conductivity value to the control unit 52. The electric conductivity detector 54 used may be a conductivity sensor known in general.

The filter 46 is disposed in the pipe 48 to remove tailings (mainly, tailings of the photo-sensitive layer and the silicone layer rubbed off from the surface of the waterless PS plate 12) in the developing solution passing through the pipe 48. An alarm device 56 is connected to the control unit 52 to notify when replacement of the filter 46 is needed when the flow rate of the developing solution passing through the pipe 38 is lower than a predetermined value. At this time the filter is replaced with a new one. The mesh of the filter may be from 10 to 500 μ, preferably 100 to 300 μ. A valve 55 is disposed in the pipe 48 and adapted to open and close the pipe 48.

A branch pipe 58 branches from the pipe 48 and is connected to an overflow tank 62 via a valve 60. The overflow tank 62 is disposed on the side of the developing solution recovery tank 22 and connected to the developing solution recovery tank 22 by a slot 64 parallel to the surface of the developing solution in the partition wall of the developing solution recovery tank 22. This permits a surface portion of the developing solution 18 in the developing solution recovery tank 22 to flow over an upper end of a lower partition wall 22A of the developing solution recovery tank 22 into the overflow tank 62. The overflow rate into the overflow tank 62 may be from 1/10 to 8/10, preferably ⅓ to ⅔ of the total quantity of solution circulated.

The developing solution recovery tank 22 is replenished with developing solution 18 by a developing solution replenishing device which will be described hereinafter, so that when the level of the developing solution 18 is raised, tailings from developing solution once collected in the overflow tank 62 cannot spread into the developing solution recovery tank 22.

The overflow tank 62 is opened at its upper portion as shown in FIG. 1 to provide an opening which can be opened and closed by a cover 66 that may be removed from the opening for maintenance of the interior of the overflow tank 62. The upper portion of the side wall of the overflow tank 62 is inclined to provide an inclined wall 68A. The branch pipe 58 is passed through the lower portion of the side wall 68 to be connected to the overflow tank 62, so that the developing solution 18 within the overflow tank 62 may be drawn therethrough by operation of the circulation pump 44. Such drawing produces a flow of the developing solution 18 in the direction of Arrow B along the inclined wall 68A. The drawing by the circulation pump 44 causes a surface portion of the developing solution 18 within the developing solution recovery tank 22 to flow into the overflow tank 62, with the result that tailings floating in the developing solution within the developing solution recovery tank 22 flow into the overflow tank 62 and are collected therein. The tailings thereby pass into the pipe 58 by a flow produced by the inclined wall 68A. In this case, an ink-repellent silicone rubber layer is laminated on the surface of the waterless PS plate 12. When the silicone rubber layer along with the photo-sensitive layer corresponding to the image area are scraped by the brushing roller 30, they become tailings and are recovered into the developing solution recovery tank 22, along with excessive developing solution. The tailings float on the surface portion of the developing solution 18 within the developing solution recovery tank 22 because of their specific gravity is lower than that of the developing solution 18. In this condition, the surface portion of the developing solution 18 flows into the overflow tank 62 for collection therein. The lower partition wall 22A serves as a so-called weir when the tailings in the solution surface in the developing solution recovery tank 22 flow into the overflow tank 62.

An overflow pipe 70 is disposed in the overflow tank 62. A lower end of the overflow pipe 70 protrudes outwardly through the bottom of the overflow tank 62. An upper end of the overflow pipe 70 is placed at a level higher than an upper end of the lower partition wall 22B of the developing solution recovery tank 22. Therefore, when the developing solution 18 is replenished by the developing solution replenishing device, which will be described hereinafter, so that the level of the developing solution within the developing solution recovery tank 62 is raised, the surface portion of the developing solution 18 in the developing solution recovery tank 22 flows outward through the overflow pipe 70 along with the tailings in the developing solution.

The developing solution replenishing device comprises a concentrate developer stock tank 72 containing concentrated developer therein, a water tank 74 containing water, a concentrated developer supply pump 76 for supplying the concentrated developer into the developing solution recovery tank 22, and a water supply pump 78 for supplying water into the developing solution recovery tank 22.

One end of a pipe 80 is connected to the concentrated developer stock tank 72 and another end of the pipe 80 is opened into a wide-necked pipe 82 disposed in the developing solution recovery tank 22. The concentrated developer supply pump 76 is disposed in the pipe 80 and connected to the control unit 52, so that the operation thereof can be controlled.

One end of a pipe 84 is connected to the water tank 74 and another end is opened into the wide-necked pipe 82 in the developing solution recovery tank 22. A water supply pump 78 is disposed in the pipe 84 and connected to the control unit 52, so that the timing of operation thereof can be controlled.

A detector 86 is disposed at an inlet of the developing section 14 for detecting the number of waterless PS plates 12 passed, i.e., the throughput of the PS plates 12 (the area of the PS plate 12) and is connected to the control unit 52 to supply a throughput signal to the control unit 52. The detector 86 may be designed to detect the area of the surface of the plate by determining the time required for the PS plate 12 to pass over the detector 86 and by using a plurality of photoelectric tubes arranged widthwise of the waterless PS plate 12 or by detecting the length of the waterless PS plate 12 by a single photoelectric tube and using the PS plate width previously stored in the control unit 52.

A heater 88 is disposed at the bottom of the developing solution recovery tank 22 and is connected to a power supply which is not shown for heating the developing solution. The temperature of the developing solution may be set from 15° to 45°, preferably 25° to 30°.

The developing time may be set from 10 seconds to 3 minutes, preferably 30 seconds to 2 minutes, and the dyeing time may be set from 5 seconds to 1 minute, preferably 10 to 30 seconds. If necessary, another developing tank can be added.

The dyeing section 16 will be described below.

A dyeing tank body 90 in the dyeing section 16 is opened upwardly in the same way as the developing tank body 20, and has a bottom formed into an inverted chevron shape so that a dyeing solution recovery tank 92 is formed at the center of the bottom. The dyeing solution 17 is contained in the dyeing solution recovery tank 92. An overflow pipe 91 is disposed in the dyeing solution recovery tank 92. An upper end of the overflow pipe 91 is located at an upper portion in the dyeing solution recovery tank 92, and a lower end of the pipe 91 protrudes outward through the bottom of the dyeing solution recovery tank 92. The overflow pipe 91 discharges the dyeing solution 17 out of the dyeing solution recovery tank 92 when the solution level in the dyeing solution recovery tank 92 is raised above the upper end of the overflow pipe 91 a dyeing solution replenishing device which will be described.

In sequence from the inlet of the dyeing tank body 90 for the waterless PS plate 12, conveyor roller pairs 94 and 96 are disposed at an upper portion of the dyeing tank body 90 in the direction of transportation of the waterless PS plate 12. The conveyor roller pairs 94 and 96 are supported on a rack sideplate which is not shown and rotate to transport the waterless PS plate 12, which is nipped between them, upon transmission of a driving force by driving means which is not shown. The conveyor roller pairs 94 and 96 may be formed of a known rubber such as silicone, EPT and NBR in order to prevent the scratching of the surface of the waterless PS plate 12 thus transported.

A conveyor roller pair 98 is disposed downstream from the dyeing tank body 90 in the direction of the transportation of the waterless PS plate 12. The conveyor roller pair 98 may be formed, for example, of NBR rubber (nitrile-butadiene rubber) so that the dyeing solution squeezing property may be improved.

A brushing roller 100 is disposed between the conveyor roller pairs 94 and 96. The brushing roller 100 is also supported on a sideplate, which is not shown, as are the conveyor roller pairs 94 and 96, and rotate in the direction opposite (clockwise direction in FIG. 1) the direction of rotation of the conveyor roller pairs 94 and 96 upon transmission of the driving force by the driving means. The brushing roller 100 is formed of a brush material embedded in a plastic or metal roller and rotates in the direction (clockwise direction in FIG. 1) resistive to the direction of transportation of the waterless PS plate 12 in order to rub the surface of the PS plate 12. When required, the brushing roller 100 may be rotated in a forward direction with respect to the direction of transportation of the waterless PS plate 12 and in this case, the speed of the brushing roller 100 may be set from 100 to 500 rpm, preferably 200 to 400 rpm. Further, it be preferable that a bar 31 is provided for preventing the waterless PS plate 12 from moving up and down.

A support plate 102 formed of a relatively soft material such as plastic, e.g., a high-density polyethylene, is disposed below the brushing roller 100. The supporting plate may be replaced by a rubber roller. Thus, when the waterless PS plate 12 is passed through the passageway, the dyeing solution 17, while the PS plate 12 is being guided on the support plate 102 is applied onto the surface of the PS plate 12 by the brushing roller 100.

A spray pipe 104 is disposed above the brushing roller 100 and surrounded by a substantially -shaped flow control plate 106. Discharge nozzle holes 104A disposed in the spray pipe 104 face the flow control plate 106.

The spray pipe 104 is connected to a dyeing solution supplying device, which will be described hereinafter, by a pipe 110 through a valve 108. This permits the dyeing solution to be fed into the spray pipe 104, discharged toward and guided by the flow control plate 106, and supplied to the brushing roller 100. In this case, the dyeing solution 17 is spread while flowing downwardly on the flow control plate and uniformly supplied onto the brushing roller 100.

A spray pipe 112 is also disposed between the brushing roller 100 and the conveyor roller pair 96 at the side of the conveyor roller pair 96 and surrounded by another substantially -shaped flow control plate 106. The spray pipe 112 has discharge nozzle holes 112A provided therein facing the flow control plate 106. The spray pipe 112 is connected to the dyeing solution supplying device by a pipe 110 which will be described hereinafter, through a valve 108. This permits the dyeing solution to be fed into the spray pipe 112, discharged toward and guided by the flow control plate 106 and thus supplied to an upper roller of the pair of conveyor rollers 96. In this case, the dyeing solution is spread while flowing downwardly on the flow control plate 106 and uniformly supplied to the conveyor roller pair 96.

A cover 107 having a generally -shaped section is disposed above the brushing roller 100 and the conveyor roller pair 96 to prevent the dyeing solution from splashing the brushing roller 100.

The dyeing solution supplying device comprises a circulation pump 114, a filter 116 and a pipe 118 which runs between the circulation pump 114 and the dyeing solution recovery tank 92. The pipe 110 is connected to a discharge port of the circulation pump 114, and one end of the pipe 118 is connected to the intake port of the circulation pump 114 and another end of the pipe 118 is connected to the bottom of the dyeing solution recovery tank 92. The operation of the dyeing solution recovery tank 92 causes the dyeing solution in the dyeing solution recovery tank 92 to be drawn through the pipe 118 into the circulation pump 114 and fed through the pipe 110 to the spray pipes 104 and 112.

The filter 116 is disposed in the pipe 118 and removes the tailings in the dyeing solution passing through the pipe 118 (tailings from the photo-sensitive layer and the silicone layer scraped from the surface of the waterless PS plate 12 carried from a main developing section).

The dyeing solution replenishing device comprises a dyeing solution tank 122 containing the dyeing solution, and a dyeing solution supply pump 124 for supplying the dyeing solution into the dyeing solution recovery tank 92.

One end of a pipe 126 is connected to the dyeing solution tank 122 and another end is opened into a wide-necked pipe 82 disposed in the dyeing solution recovery tank 92. The dyeing solution supply pump 124 is disposed in the pipe 126 and connected to the control unit 52, so that the timing of operation thereof, i.e., the operation for replenishment of the dyeing solution 17, can be controlled. The amount of dyeing solution replenished may be from 5 to 100 cc/m$^2$, preferably 10 to 60 cc/m$^2$.

A heater 88 is disposed at the bottom of the dyeing solution recovery tank 92 and connected to a power supply, which is not shown, to heat the dyeing solution. The temperature of the dyeing solution may be set from 15° to 45° C., preferably 20° to 30° C. If necessary, another dyeing tank may be added.

The operation of this embodiment will be described below.

A waterless PS plate 12 on which an image has been exposed by an image printer (not shown) is inserted into the developing section 14 after passing over the detector 86. The area of the photo-sensitive layer of the waterless PS plate 12 inserted into the developing section 14 which has been imagewisely exposed to light, i.e., an exposed area, is hardened and adheres to a primer layer. The unexposed area becomes wettable by or dissolvable in the developing solution 18.

The protective film, laminated to protect the surface of the waterless PS plate 12, is peeled off. Then, the PS plate 12 is inserted into the developing section 14 where the developing solution is applied to the surface of the PS plate 12 while the PS plate 12 is being transported and nipped between the conveyor roller pair 24 in the developing section 14. Consequently, the photo-sensitive layer in the unexposed area of the waterless PS plate 12 is wetted and is easily peeled off from the primer layer.

The waterless PS plate 12 is transported by and pressed between the conveyor roller pair 26 and inserted between the brushing roller 30 and the supporting plate 32. The brushing roller 30 is rotated in the forward direction (counterclockwise direction in FIG. 1) with respect to the direction of transportation of the PS plate 12 to rub the surface of the PS plate 12 passing over the supporting plate 32. The developing solution 18 is also supplied to the brushing roller 30 and the surface of the PS plate 12. While the developing solution 18 is being supplied thereto, the PS plate 12 is rubbed by the brushing roller 30, whereby the photo-sensitive layer and the silicone rubber layer wetted by or dissolved in the developing solution are scraped off. As a result, the photo-sensitive layer and the silicone layer remain on the waterless PS plate 12 at the area corresponding to the exposed area (non-image area) to form a positive image.

After development, excess developing solution 18 applied onto the surface of the waterless PS plate 12 is dropped into and recovered in the developing solution recovery tank 22.

The waterless PS plate 12 with the photo-sensitive layer and silicone layer in the unexposed area (image area) scraped by the brushing roller 30 is pressed between and transported by the conveyor roller pair 28. The developing solution is applied again to the PS plate 12 and, thereafter squeezed off from the PS plate 12. The waterless PS plate 12 in this condition is inserted between the conveyor roller pair 94 in the dyeing section 16. The waterless PS plate 12 is pressed between and transported by the conveyor roller pair 94 and inserted between a brushing roller 100 and a support plate 102. The brushing roller 100 is rotated in the direction (clockwise direction in FIG. 1) resistive to the direction of transportation of the PS plate 12 to apply the dyeing solution guided by the flow control plate 104 and supplied onto the surface of the waterless PS plate 12. When required, the brushing roller 100 may be rotated in a forward direction with respect to the direction of transportation of the PS plate 12. This results in the adhesion of the dyeing solution onto the primer layer, i.e., the unexposed area (image area) to dye it.

Further, the waterless PS plate is inserted between the conveyor roller pair 96. While the drying solution guided by the flow control plate 106 and supplied to the upper roller of the pair of conveyor rollers 96 is being applied to the surface of the plate 12, the dyeing solution 17 is squeezed out. The surfaces of the image and non-image areas of the waterless PS plate 12 after being subjected to development are of the same color. This dyeing process is made to facilitate the discrimination between the image area and the non-image area for inspection of the plate.

After being delivered from the dyeing section 16, the waterless PS plate 12 with the dyed image area is inserted between a pair of conveyor rollers 98, whereby the dyeing solution 17 remaining on the surface is wiped off. The dyeing solution wiping property is improved by the pair of conveyor rollers 98, because they are formed of, for example, NBR rubber. Particularly, if the dyeing solution remains on the non-image area, the ink repellent force of the silicone rubber layer is reduced and hence, good image characteristics cannot be achieved upon printing. However, the dyeing solution is reliably squeezed off from the surface of the plate by the pair of conveyor rollers 98 and therefore, good characteristics can be achieved.

Description will now be made of the circulation of the developing solution, the removal of tailings therefrom and the replenishing thereof in the developing section 14.

Circulation

As shown in FIG. 1, the developing solution 18 in the developing solution recovery tank 22 is fed to the spray pipes 34, 40 and 42 by the operation of the circulation pump 44 and applied onto the waterless PS plate 12 transported through the developing section 14. The excess developing solution 12, after the developing solution 12 is applied to the waterless PS plate 12, is dropped into and recovered in the developing solution recovery tank 22. The tailings, such as the photo-sensitive layer and the silicone rubber layer peeled off from the surface of the PS plate 12, contained in the developing solution are recovered in the developing solution recovery tank 22 and float on the surface of the developing solution in the developing solution recovery tank 22 because their specific gravity is less than that of water.

Removal of Tailings

In this condition, the developing solution in the developing solution recovery tank 22 flows over the partition wall 22A into the overflow tank 62. As a result, the tailings floating on the surface layer of the developing solution 18 flow into the overflow tank 62 and are collected therein.

On the other hand, the developing solution 18 in the overflow tank 62 is drawn out by the operation of the circulation pump 44 through the branch pipe 58. This drawing produces a flow along the inclined wall 68A in the overflow tank 62 (in the direction indicated by arrow B). This causes the tailings collected in the overflow tank 62 to be guided into the branch pipe 58 along this liquid flow.

If the filter 46 is clogged by the tailings, the circulation flow rate of developing solution passing through the pipe 38 is reduced. The flow rate sensor 50 detects this clogging to transfers the detected result to the control unit 52. Then, the control unit 52 operates the alarm device 56 to indicate the clogging of the filter. This makes it possible for the operator to become aware of the need of replacement of the filter 46.

Further, if the developing solution 18 or water is replenished into the developing solution recovery tank 22, the level of the developing solution 18 in the developing solution recovery tank 22 is raised. If the level is raised over the through-hole 64, the level of the developing solution (tailings are collected on the surface) in the overflow tank 62 is also raised and ultimately, the upper end of the overflow pipe 70 is submerged to the solution. This causes the surface layer of the developing solution in the overflow tank 62 to be discharged outward through the overflow pipe 70. In this case, the upper partition wall 22B, forming the through-hole of the developing solution recovery tank 22, serves as a weir to prevent the tailings once collected in the overflow tank 62 from being spread into the developing solution recovery tank 22 due to the raising of level of the developing solution.

In this way, the circulation path of the developing solution 18 is of a two-series type comprising the branch pipe 58 and the pipe 48 in this embodiment, so that the tailings can be removed from the developing solution. Therefore, the tailing are not accumulated in the developing solution recovery tank 22 and the circulation pump 44, resulting in the facilitation of maintenance.

Replenishment of Developing Solution

The waterless PS plate 12 placed into the developing section 14 is detected by the detector 86 in correspondence with the throughput thereof.

The control unit 52 operates the developing solution supply pump 76 on the basis of the result of detection to supply concentrated developing solution into the developing solution recovery tank 22. This replenishment is performed depending upon the throughput or area of the waterless PS plate to recover the developing solution deteriorated due to processing. The amount of replenishment may be set from 5 to 500 cc/m$^2$, preferably 20 to 200 cc/m$^2$.

Further, the electrical conductivity of the developing solution 18 is detected by the conductivity detector 54, and the result is transferred to the control unit 52. In this manner, the content of water in the developing solution 18 is detected. If the water in the developing solution 18 is evaporated to concentrate the developing solution 18, the electrical conductivity of the developing solution 18 is reduced. If the conductivity reaches a predetermined value, the control unit 51 operates the water supply pump 78 to supply water into the developing solution recovery tank 22. The amount of water thus replenished may be set from 500 to 1000 cc/run. This prevents the developing solution from being concentrated, and the water replenishment as well as the replenishment based upon the area of the plate to be processed, makes the activity of the developing solution 18 constant, which enables stabilized development over a long period of time.

A description of the replenishment of the dyeing solution in the dyeing section 16 will now be made.

The developing solution 18 remains on the surface of the waterless PS plate 12 inserted into the dyeing section 16, and in this condition, the dyeing solution is applied onto the PS plate 12. For this reason, the developing solution 18 is carried into the dyeing solution 17 to be recovered in the dyeing solution recovery tank 92 and hence, the dyeing solution 17 is deteriorated. In addition, the dyeing solution may be deteriorated depending upon the quantity of the waterless PS plate processed. Therefore, on the basis of the detection result of the area of the waterless PS plate 12 detected by the detector, the control unit 52 operates the dyeing solution supply pump 124 to supply the dyeing solution into the dyeing solution recovery tank 92. This permits the dyeing process to stabilize for a long period of time without any reduction in dyeing capability of the dyeing solution.

A second embodiment of the present invention will be described below with reference to FIG. 2.

In this embodiment, components and portions similar to those in the first embodiment are designated by the same reference characters as in the first embodiment, and the description thereof is omitted.

In this embodiment, the structure of the overflow tank 162 is different from that in the first embodiment. More specifically, the inclined wall 68A as used in the first embodiment is not provided in the overflow tank 162 in this embodiment. Therefore, in this embodiment, if the developing solution 18 is replenished by a developing solution replenishing means and the solution level in the developing solution recovery tank 22 is raised (as shown by a two-dashed line in FIG. 2), the opening in the overflow pipe 70 is submerged in the solution, so that the surface portion of the developing solution 18 in the overflow tank 162 flows out through the overflow pipe 70 along with the tailings.

The upper end of the overflow pipe 70 is normally opened in this embodiment. Alternatively, the overflow pipe 70 may be of a construction such that a valve may be provided therein so as to permit the tailings collected into the overflow tank 162 to be discharged. In this embodiment, the upper end of the overflow pipe 70 is normally opened, but a valve may be placed therein. The valve may be opened at an appropriate timing to discharge collected tailings outside. In addition, the level of the upper end of the overflow pipe 70 may be located slightly lower than the level of the developing solution 18 during circulation (a location shown by a solid line in FIG. 2). In this location, the valve can be opened during circulation of the developing solution 18, permitting the tailings to be discharged.

What is claimed is:

1. A waterless presensitized lithographic printing plate processing apparatus for processing a waterless presensitized lithographic printing plate on which an image has been exposed, while transporting the plate, comprising
   a developing device for developing said waterless presensitized lithographic printing plate using an aqueous developing solution containing an organic solvent,
   a developing solution recovery tank for recovering excessive aqueous developing solution,
   said developing solution recovery tank being arranged to recover said excessive aqueous developing solution along with tailings in said developing solution, and
   means for removing said tailings from the developing solution recovery tank.

2. A waterless presensitized lithographic printing plate processing apparatus according to claim 1, further including a dyeing device disposed downstream of said developing solution recovery tank in a direction of transportation of said waterless presensitized lithographic printing plate for dyeing the developed waterless presensitized lithographic printing plate using an aqueous solution containing a dye.

3. A waterless presensitized lithographic printing plate processing apparatus according to claim 2, wherein said developing device comprises means for applying said aqueous developing solution onto said waterless presensitized lithographic printing plate, and means for removing a light-sensitive layer and a silicone rubber layer from said waterless presensitized lithographic printing plate with said aqueous developing solution applied thereto.

4. A waterless presensitized lithographic printing plate processing apparatus according to claim 3, wherein said dyeing device comprises means for applying said aqueous solution onto said waterless presensitized lithographic printing plate to dye it, and a dyeing solution recovery tank for recovering the excessive aqueous solution.

5. A waterless presensitized lithographic printing plate processing apparatus according to claim 1, wherein said removing means includes a collection tank into which the surface portion of the aqueous developing solution recovered in said developing solution recovery tank flows for collection of said tailings floating on the surface of said aqueous developing solution.

6. A waterless presensitized lithographic printing plate processing apparatus according to claim 5, wherein said developing solution recovery tank and said collection tank are connected with each other through a weir.

7. A waterless presensitized lithographic printing plate processing apparatus according to claim 5, wherein said removing means includes means for discharging said tailings out of said collection tank.

8. A waterless presensitized lithographic printing plate processing apparatus according to claim 5, wherein said discharging means includes a first pipe which is disposed in said collection tank and into which the surface portion of said aqueous developing solution in said collection tank flows, whereby said tailings floating on said surface are discharged.

9. A waterless presensitized lithographic printing plate processing apparatus according to claim 8, wherein said discharging means includes drawing means for drawing said aqueous developing solution in said collection tank through a second pipe, thereby promoting the flow of the surface portion of said aqueous developing solution from said developing solution recovery tank into said collection tank.

10. A waterless presensitized lithographic printing plate processing apparatus according to claim 9, wherein said collection tank includes a guide wall for guiding the surface portion of said aqueous developing solution in said collection tank into said second pipe.

11. A waterless presensitized lithographic printing plate developing apparatus for processing a waterless presensitized lithographic printing plate on which an image has been exposed, while transporting the plate, comprising
    a developing device including applying means for applying an aqueous developing solution containing an organic solvent onto said waterless presensitized lithographic printing plate; means for removing a light-sensitive layer and a silicon rubber layer from said waterless lithographic printing plate, and a developing solution recovery tank for recovery of excess aqueous developing solution along with tailings;
    a dyeing device disposed downstream of said developing solution recovery tank in a direction of transportation of said waterless presensitized lithographic printing plate for dyeing said printing plate using an aqueous solution containing a dye; and
    means for removing said tailings from said developing solution recovery tank.

12. A waterless presensitized lithographic printing plate developing apparatus according to claim 11, wherein said removing means includes a collection tank into which a surface portion of said aqueous developing solution recovered in said developing solution recovery tank flows for collection of said tailings floating on the surface of said aqueous developing solution.

13. A waterless presensitized lithographic printing plate developing apparatus according to claim 12, wherein said developing solution recovery tank and said collection tank are connected with each other through a weir.

14. A waterless presensitized lithographic printing plate developing apparatus according to claim 13, wherein said removing means includes means for discharging said tailings out of said collection tank.

15. A waterless presensitized lithographic printing plate developing apparatus according to claim 14, wherein said discharging means includes a first pipe which is disposed in said collection tank and into which the surface portion of said aqueous developing solution in said collection tank flows, whereby said tailings floating on said surface are discharged.

16. A waterless presensitized lithographic printing plate developing apparatus according to claim 15, wherein said discharging means includes drawing means for drawing said aqueous developing solution in said collection tank through a second pipe, thereby promoting the flow of the surface portion of said aqueous developing solution from said developing solution recovery tank into said collection tank.

17. A waterless presensitized lithographic printing plate developing apparatus according to claim 16, wherein said collection tank includes a guide wall for guiding the surface portion of said aqueous developing solution in said collection tank into said second pipe.

18. A developing device for developing a waterless presensitized lithographic printing plate, comprising: means for delivering a developing solution to said plate, means for recovering excessive developing solution and including a main developing solution tank, an overflow tank connected to said main tank through a weir, and overflow means arranged in said overflow tank for disposing of tailings collected in said overflow tank by floating over said weir.

19. A developing device as claimed in claim 18, wherein said means for delivering a developing solution to said plate includes developing solution recirculating means coupled to at least one of said main tank and said overflow tank, said recirculating means including a conductivity detector for monitoring the conductivity of the recirculated solution and a flow rate sensor for monitoring the rate of developing solution flow through said recirculating means.

* * * * *